United States Patent [19]
Roohparvar et al.

[11] Patent Number: 5,568,426
[45] Date of Patent: Oct. 22, 1996

[54] METHOD AND APPARATUS FOR PERFORMING MEMORY CELL VERIFICATION ON A NONVOLATILE MEMORY CIRCUIT

[75] Inventors: Fariborz F. Roohparvar, Cupertino; Michael S. Briner, San Jose, both of Calif.

[73] Assignee: Micron Quantum Devices, Inc., Santa Clara, Calif.

[21] Appl. No.: 507,160

[22] Filed: Jul. 26, 1995

[51] Int. Cl.$^6$ .................................................. G11C 29/00
[52] U.S. Cl. ........................... 365/185.22; 365/183.3; 365/185.33; 365/189.07; 365/189.08
[58] Field of Search ........................... 365/185.3, 185.29, 365/185.33, 185.22, 189.07, 218, 189.08

[56] References Cited

U.S. PATENT DOCUMENTS

| | | | |
|---|---|---|---|
| 5,335,198 | 8/1994 | Van Buskirk et al. | 365/185.22 |
| 5,386,388 | 1/1995 | Atwood et al. | 365/185.22 |
| 5,408,433 | 4/1995 | Hashimoto | 365/185.22 |

*Primary Examiner*—Tan T. Nguyen
*Attorney, Agent, or Firm*—Limbach & Limbach L.L.P.

[57] ABSTRACT

A method for verifying the status of selected nonvolatile memory cells of an integrated memory circuit, such as during a memory erase or programming operation, and an integrated nonvolatile memory circuit including circuitry for performing this verification method. Preferably, the invention employs simple logic circuitry including a flip-flop to assert successful verification data only in response to a continuous validity of a verification signal throughout a sampling period, thereby avoiding false assertion of successful verification data. The sampling period is preferably longer than the expected duration of fluctuations due to noise in the verification signal. During the sampling period of a verification operation, the logic circuitry receives a raw verification signal indicative of the instantaneous relation between a measured threshold voltage of a selected memory cell and a reference voltage. The raw verification signal is valid if the threshold voltage has a desired relation to the reference voltage at an instant of time. The flip-flop remains in a first state while the raw verification signal is valid, but enters a second state in response to the raw verification signal going invalid and remains in the second state for the rest of the sampling period. An output signal from the logic circuitry indicates the state of the flip-flop at the end of the sampling period. A level of the output signal indicating that the flip-flop is in the first state at the end of the sampling period is interpreted as successful verification data.

29 Claims, 7 Drawing Sheets

METHOD AND APPARATUS FOR PERFORMING MEMORY CELL VERIFICATION ON A NONVOLATILE MEMORY CIRCUIT

BACKGROUND OF THE INVENTION

1. Field of the Invention

The present invention relates to integrated nonvolatile memory circuits (preferably, integrated flash memory circuits) which perform a verification operation to verify the status of selected memory cells during each of one or more stages of a memory erase or programming operation, and to methods for performing such a verification operation. The nonvolatile memory circuit of the invention includes logic means for asserting successful verification data only in response to continuous validity of a verification signal during a sampling period of sufficient duration, thereby avoiding false assertion of successful verification data.

2. Description of Related Art

Throughout the specification, including in the claims, the term "connected" is used (in the context of an electronic component being "connected" to another electronic component) in a broad sense to denote that the components are electrically or electromagnetically coupled with sufficient strength under the circumstances. It is not used in a narrow sense requiring that an electrically conducting element is physically connected between the two components.

Nonvolatile memory chips (integrated circuits) are becoming increasingly commercially important. A typical nonvolatile memory chip includes an array of nonvolatile memory cells, each cell comprising a transistor having a floating gate capable of semipermanent charge storage. The current drawn by each cell depends on the amount of charge stored on the corresponding floating gate. Thus, the charge stored on each floating gate determines a data value that is stored "semipermanently" in the corresponding cell.

One particularly useful type of nonvolatile memory chip includes an array of flash memory cells, with each cell comprising a flash memory device (a transistor). The charge stored on the floating gate of each flash memory device (and thus the data value stored by each cell) is erasable by appropriately changing the voltage applied to the gate and source (in a well known manner).

FIG. 1 is a simplified block diagram of a conventional nonvolatile memory chip. Integrated circuit 3 of FIG. 1 includes at least one I/O pad 30 (for asserting output data to an external device or receiving input data from an external device), input/output buffer circuit 10 for I/O pad 30, address buffers A0 through Ap for receiving memory address bits from an external device, row decoder circuit (X address decoder) 12, column multiplexer circuit (Y multiplexer) 14, and memory array 16 (comprising columns of nonvolatile memory cells, such as column 16A). Each of address buffers A0 through Ap includes an address bit pad for receiving (from an external device) a different one of address bit signals X0 through Xn and Y0 through Ym.

I/O buffer circuit 10 includes a "write" branch and a "read" branch." The write branch comprises input buffer 18. The read branch comprises sense amplifier 19 and output buffer 20. Chip 3 executes a write operation by receiving data (to be written to memory array 16) from an external device at I/O pad 30, buffering the data in the write branch, and then writing the data to the appropriate memory cell. Chip 3 can also be controlled to execute a read operation in which it amplifies and buffers data (that has been read from array 16) in the read branch, and then assert this data to I/O pad 30.

Although only one I/O pad (pad 30) is shown in FIG. 1, typical implementations of the FIG. 1 circuit include a plurality of I/O pads, and each I/O pad is buffered by an I/O buffer circuit similar or identical to circuit 10. For example, one implementation of the FIG. 1 circuit includes eight I/O pads, eight buffer circuits identical to circuit 10, one line connected between the output of the output buffer 20 of each buffer circuit and one of the I/O pads (so that eight data bits can be read in parallel from buffers 20 to the pads), and one line connected between the input of the input buffer 18 of each buffer circuit and one of the I/O pads (so that eight data bits can be written in parallel from the pads to buffers 18). Each I/O pad (including I/O pad 30) typically has high impedance when the output buffer is not enabled.

Each of the cells (storage locations) of memory array circuit 16 is indexed by a row index (an "X" index determined by decoder circuit 12) and a column index (a "Y" index output determined by decoder circuit 14). FIG. 2 is a simplified schematic diagram of two columns of cells of memory array 16 (with one column, e.g., the column on the right, corresponding to column 16A of FIG. 1). The column on the left side of FIG. 2 comprises "n" memory cells, each cell implemented by one of floating-gate N-channel transistors N1, N3, ..., Nn. The drain of each of transistors N1–Nn is connected to bitline 13, and the gate of each is connected to a different wordline (a different one of wordline 0 through wordline n). The column on the right side of FIG. 2 also comprises "n" memory cells, each cell implemented by one of floating-gate N-channel transistors N2, N4, ..., Nm. The drain of each of transistors N2–Nm is connected to bitline 15, and the gate of each is connected to a different wordline (a different one of wordline 0 through wordline n). The source of each of transistors N1, N3, ..., Nn, and N2, N4, ..., Nm is held at a source potential (which is usually ground potential for the chip during a read or programming operation).

In the case that each memory cell is a nonvolatile memory cell, each of transistors N1, N3, ... Nn, and N2, N4, ..., Nm has a floating gate capable of semipermanent charge storage. The current drawn by each cell (i.e., by each of transistors N1, N3, ..., Nn, and N2, N4, ..., Nm) depends on the amount of charge stored on the corresponding floating gate. Thus, the charge stored on each floating gate determines a data value that is stored "semipermanently" in the corresponding cell. In cases in which each of transistors N1, N3, ..., Nn, N2, N4, ..., and Nm is a flash memory device (as indicated in FIG. 2 by the symbol employed to denote each of transistors N1, N3, ..., Nn, N2, N4, ..., and Nm), the charge stored on the floating gate of each is erasable (and thus the data value stored by each cell is erasable) by appropriately changing the voltage applied to the gate and source (in a well known manner).

In response to address bits Y0–Ym, circuit 14 (of FIG. 1) determines a column address which selects one of the columns of memory cells of array 16 (connecting the bitline of the selected column to Node 1 of FIG. 1), and in response to address bits X0–Xn, circuit 12 (of FIG. 1) determines a row address which selects one cell in the selected column. Consider an example in which the column address selects the column on the right side of FIG. 2 (the column including bitline 15) and the row address selects the cell connected along wordline 0 (the cell comprising transistor N2). To read the data value stored in the selected cell, a signal (a current signal) indicative of such value is provided from the cell's drain (the drain of transistor N2, in the example), through bitline 15 and circuit 14, to node 1 of FIG. 1. To write a data value to the selected cell, a signal indicative of such value is provided to the cell's gate and drain (the gate and drain of transistor N2, in the example).

More specifically, the FIG. 1 circuit executes a write operation as follows. Each of address buffers A0 through An asserts one of bits X0–Xn to decoder circuit 12, and each of address buffers An+1 through Ap asserts one of bits Y0–Ym to multiplexer circuit 14. In response to these address bits, circuit 14 determines a column address (which selects one of the columns of memory cells of array 16, such as column 16A), and circuit 12 determines a row address (which selects one cell in the selected column). In response to a write command (which can be supplied from control unit 29, or other circuitry to be described below), a signal (indicative of data) present at the output of input buffer 18 is asserted through circuit 14 to the cell of array 16 determined by the row and column address (e.g., to the drain of such cell). During such write operation, output buffer 20 may be disabled. A data latch (not shown) is typically provided between input buffer 18 and I/O pad 30 for storing data (to be written to a memory cell) received from I/O pad 30. When the latched data is sent to input buffer 18, input buffer 18 produces a voltage at Node 1 which is applied to the selected memory cell. Input buffer 18 is typically implemented as a tri-statable driver having an output which can be placed in a high impedance mode (and thus disabled) during a read operation. In some implementations, the functions of the latch and input buffer 18 are combined into a single device.

The FIG. 1 circuit executes a read operation as follows. Each of address buffers A0 through An asserts one of bits X0–Xn to address decoder circuit 12, and each of address buffers An+1 through Ap asserts one of bits Y0–Ym to address decoder circuit 14. In response to these address bits, circuit 14 asserts a column address to memory array 16 (which selects one of the columns of memory cells, such as column 16A), and circuit 12 asserts a row address to memory array 16 (which selects one cell in the selected column). In response to a read command (supplied from control unit 29, or from other circuitry to be described below), a current signal indicative of a data value stored in the cell of array 16 (a "data signal") determined by the row and column address is supplied from the drain of the selected cell through the bitline of the selected cell and then through circuit 14 to sense amplifier 19. This data signal is processed in amplifier 19 (in a manner to be described below), and the output of amplifier 19 is buffered in output buffer 20 and finally asserted at I/O pad 30.

When reading a selected cell of array 16, if the cell is in an erased state, the cell will conduct a first current which is converted to a first voltage in sense amplifier 19. If the cell is in a programmed state, it will conduct a second current which is converted to a second voltage in sense amplifier 19. Sense amplifier 19 determines the state of the cell (i.e., whether it is programmed or erased corresponding to a binary value of 1 or 0, respectively) by comparing the voltage indicative of the cell state to a reference voltage. The outcome of this comparison is an output which is either high or low (corresponding to a digital value of one or zero) which sense amplifier 19 sends to output buffer 20, which in turn asserts a corresponding data signal to I/O pad 30 (from which it can accessed by an external device.

Nonvolatile memory chip 3 of FIG. 1 can also execute an erase operation in which all or selected ones of the cells of memory array 16 are erased in response to a sequence of one or more commands (e.g., an "Erase Setup" command followed by an "Erase Confirm" command)), by discharging a quantity of charge stored on the floating gate of each cell. Typically, all cells of array 16 or large blocks of such cells are erased at the same or substantially the same time during an erase operation. Each erase operation comprises a sequence of steps, including "verification" steps for verifying that the cells have desired threshold voltages at each of one or more stages of the erase operation. A verification step is also typically performed during a cell programming operation (in which a cell is programmed to have a threshold voltage different from the threshold voltage of an erased cell), to determine whether the cell has been programmed to have the desired threshold voltage.

More specifically, if cells of memory array 16 of FIG. 1 are to be erased, an "Erase Setup" command and then an "Erase Confirm" command are sent from an external device to I/O pad 30. Where each such command comprises parallel bits, the different bits are sent in parallel to I/O pad 30 and to additional I/O pads identical to I/O pad 30. The command is transferred from I/O pad 30 (or from I/O pad 30 and additional I/O pads) to input buffer 18 (or input buffer 18 and input buffers connected to the other I/O pads), and then to control unit 29. Control unit 29, which typically includes command execution logic and a state machine, processes each command to generate instruction data, and supplies the instruction data to circuit 14 and sense amplifier 19 (and to other components of memory chip 3 of FIG. 1) to cause chip 3 to execute a sequence of steps required for erasing the specified cells of array 16. These steps include verification steps (e.g., the verification step discussed below with reference to FIG. 7) for verifying that the cells have desired threshold voltages at each of one or more stages of the erase operation.

During each verification step, verification data (denoted as "RAW VERIFY OK" in FIG. 1) is output from AND gate 22 (in response to the output of sense amplifier 19). This verification data can be fed back to control unit 29. Typically, an external device polls output pads of chip 3 in order to determine whether the erase operation has been completed and whether the erase operation was successful.

A conventional memory erase operation is next described in greater detail with reference to FIG. 3. FIG. 3 is a block diagram of a conventional flash memory system 103 which is a variation on memory chip 3 of FIG. 1 which performs essentially all the same functions as does chip 3. The components of flash memory system 103 which correspond to components of memory chip 3 of FIG. 1 are identified by the same reference numerals as in FIG. 1. Memory array 16 of system 103 consists of flash memory cells arranged in rows and columns with there being a total of 256K of eight bit words in the array. The individual cells (not depicted) are addressed by eighteen address bits (A0–A17), with nine bits being used by X decoder circuit 12 to select the row of array 16 in which the target cell is located and the remaining nine bits being used by Y decoder circuit 14A (of Y-multiplexer 14) to select the appropriate column of array 16.

Internal state machine 120 of memory system 103 controls detailed operations of system 103 such as the various individual steps necessary for carrying out programming, reading and erasing operations. State machine 120 thus functions to reduce the overhead required of the external processor (not depicted) typically used in association with system 103.

If memory array 16 is to be erased (typically, all or large blocks of cells are erased at the same time), the processor must cause the Output Enable $\overline{OE}$ pin to be inactive (high), and the Chip Enable $\overline{CE}$ and Write Enable $\overline{WE}$ pins to be active (low). The processor can then issue an 8 bit command 20H (0010 0000) on data I/O pins DQ0–DQ7, typically called an Erase Setup command (one of I/O pins DQ0–DQ7 corresponds to I/O pad 30 of FIG. 1). This is followed by issuance of a second eight bit command D0H (1101 0000), typically called an Erase Confirm command. Two separate commands are used so as to minimize the possibility of an inadvertent erase operation.

The commands are transferred to data input buffer 122 (input buffer 18 of FIG. 1 corresponds to a component of buffer 122 which receives one bit of each command) and the commands are then transferred to command execution logic unit 124. Logic unit 124 then instructs state machine 120 to perform all of the numerous and well known steps for erasing array 16. Once the erase sequence is completed, state machine 120 updates an 8 bit status register 126, the contents of which are transferred to data output buffer 128 which is connected to data I/O pins DQ0–DQ7 of the memory system (output buffer 18 of FIG. 1 corresponds to a component of buffer 128 which receives one bit from register 126). The processor will periodically poll the data I/O pins to read the contents of status register 126 in order to determine whether the erase sequence has been completed and whether it has been completed successfully.

FIGS. 4A and 4B are a flow chart showing a typical erase sequence as it is carried out by state machine 120. It should be noted that during any erase operation, there is a possibility that one or more cells of array 16 will become what is termed "overerased". The objective of the erase sequence is to erase all the cells of array 16 so that the threshold voltages are all within a specified voltage range. That range is typically a small positive voltage range such as +1.5 to +3.0 volts. If the erased cells fall within this range, the cell to be read (the "selected" or "target") cell will produce a cell current in a read operation. The presence of cell current flow indicates that the cell is in an erased state (logic "1") rather than a programmed state (logic "0"). Cell current is produced in an erased cell because the voltage applied to the control gate of the cell, by way of the word line from the array connected to X decoder 12, will exceed the threshold voltage of the erased cell by a substantial amount. In addition, cells which are not being read ("deselected" cells) are prevented from producing a cell current even if such cells have been erased to a low threshold voltage state. By way of example, for cells located in the same row as the selected cell, by definition, share the same word line as the selected cell. However, the drains of the deselected cells will be floating thereby preventing a cell current from being generated. Deselected cells in the same column will not conduct cell current because the word lines of such deselected cells are typically grounded. Thus, the gate-source voltage of these cells will be insufficient to turn on these deselected cells even if they are in an erased state.

Once array 16 has been erased, the vast majority of its cells will have a proper erased threshold voltage. However, it is possible that a few (or even one) of the cells may have responded differently to the erase sequence and such cell(s) have become overerased. If a cell has been overerased, the net charge on the floating gate will be positive. The result will be that the threshold voltage will be negative to some extent. Thus, when the word line connected to such overerased deselected cell is grounded, the deselected cell will nevertheless conduct current. This current will interfere with the reading of the selected cell thereby preventing proper memory operation. A principal objective of the erase sequence of FIGS. 4A and 4B is to prevent the overerase condition from occurring.

With reference again to the FIG. 4A and 4B flow chart, the erase sequence is initiated (step 28) by the issuance of the two above-noted erase commands. Once the commands have been received by command execution logic 124 (shown in FIG. 3), state machine 120 will first cause all cells of array 16 to be programmed. This is done so that all cells are in essentially the same condition when they are subsequently erased. This reduces the likelihood that one or more of the cells will become overerased since all of the cells will have an increased tendency to respond to the subsequent erase sequence in the same manner. Then, as indicated by block 30, an address counter (component 118 of FIG. 3) is initialized to the first address of the memory. Next, as indicated by block 32, the voltages used for programming are set to the proper level (including by providing high voltage Vpp, e.g. equal to +12 volts, from Vpp switch 121 of FIG. 3 to status register 126, X and Y decoders 12 and 14A, and other components of FIG. 3).

Once the voltages are set, an internal program pulse counter (not depicted) is initialized as shown by block 34 of FIG. 4A. This counter will keep track of the number of programming pulses that have been applied to the cells of the word (byte) being programmed. Next, a programming pulse is applied to the cells of the word located at the first address of the memory, as indicated by block 36. The pulse counter is then incremented (block 38) and a determination is made as to whether a predetermined maximum number of pulses have been applied to the cells (block 40). If that is the case, the cells are read to determine whether the cells have, in fact, been programmed (verification operation 42). This is accomplished using sense amplifiers and associated components represented by block 100 of FIG. 3.

If the cells are still not programmed at this point, there has been a failure since the maximum number of programming pulses has been exceeded. Depending upon the particular memory, the sequence will be terminated or a record of the failed word will be made and the sequence continued. This information will then be transferred to status register 126 (FIG. 3) so that it can be read by the processor. One potential cause of such a failure is that the memory endurance may have been exceeded. In other words, the memory has been cycled too many times.

Assuming that the maximum count has not been exceeded, the byte is verified as indicated by operation 44. If the byte has not been programmed, a further programming pulse is applied (block 36) and the counter is incremented (block 38). Assuming that the maximum count has still not been exceeded, the byte is again verified (operation 44). This sequence will continue until the byte finally passes the verification test or until the pulse counter is at the maximum.

Assuming that the first byte is eventually successfully programmed, a determination is made as to whether the last address of array 16 has been programmed (step 46). If that is not the case, address counter 118 (of FIG. 3) is incremented to the second address (block 48) and the internal pulse counter reset (block 34). A first programming pulse is applied to the byte of the second address (block 36) and the sequence is repeated. This process will continue until all cells of array 16 have either been programmed or until a determination is made that there is a programming failure.

Assuming that all of the cells have been successfully programmed and verified, state machine 120 will continue the erase sequence by setting the appropriate voltages used for erasing, including the initialization of the address counter 118 (block 49 of FIG. 4B) and the setup of the appropriate voltages for erasing, including voltage Vpp (block 50).

Next., an internal erase pulse counter is reset (block 52) and a single erase pulse is applied to all of the cells of array 16 (or to the block of the array being erased in the event that capability is provided). The cells of array 16 will then be sequentially read (erase verification step 58) in order to determine whether all cells have been successfully erased. Before step 58, the conditions necessary for erase verification, namely those for cell reading, are set up (block 56) and the first cell of array 16 is read.

A single erase pulse is almost never sufficient to accomplish an erasure so that the test (step 58) will almost always fail. The state of the erase pulse counter is then examined (step 60) and a determination is made that the maximum count has not been exceeded. Accordingly, a second erase pulse is applied to the entire array 16 (step 54) and the first byte is again tested (step 58).

Once the byte has received a sufficient number of erase pulses and has passed the verification test (step 58), the address is incremented (step 64) and the second byte is tested (steps 56 and 58) to determine whether the second byte has been successfully erased. Since the cells are not always uniform, it is possible that the second byte has not been erased even though it has received the same number of erase pulses received by the first byte. In that event, a further erase pulse is applied to the entire array 16 and the second byte is again tested for a proper erase. Note that the address is not reset at this point since it is not necessary to retest those bytes that have already been erased. However, there is a possibility that those earlier erased bytes will become overerased, as will be explained.

Once it has been established that the second byte has been properly erased, a determination is made as to whether the last address of array 16 has been verified (step 62). If that is not the case, address counter 118 is incremented (step 64) and the third byte is tested. Additional erase pulses will be applied if necessary. The internal erase pulse counter (step 60) will monitor the total number of erase pulses applied in the erase sequence. If a maximum number has been exceeded, the sequence will be terminated and one of the bits of status register 126 will be set to reflect that an erase error has occurred.

Assuming that the second byte of cells has been properly erased, the remaining bytes will be verified and any necessary additional erase pulses will be applied. Once the last address has been verified, the erase sequence is ended and status register 126 is updated to indicate that the erase sequence has been successfully completed.

In order to achieve higher density, nonvolatile memory chip manufacturers have been decreasing the size of elements of such chips (e.g., the size of each cell of a memory array implemented in each chip). With memory array cells having submicron feature sizes, the slightest change in processing of one memory cell relative to another during manufacture results in a big difference in the behavior of the cells with respect to each other.

Important advantages of a nonvolatile memory chip comprising an array of flash memory cells over a nonvolatile memory chip comprising an array of EPROM memory cells include system program capability. Important advantages of a nonvolatile memory chip comprising an array of flash memory cells over a nonvolatile memory chip comprising an EEPROM memory cell array include low cost. However, nonvolatile memory chips comprising flash memory cell arrays (especially those manufactured with very small element size) have been subject to problems (such as "overerasure" and "wild bits") due to cell-to-cell variations (occurring during circuit manufacture) in the behavior of each flash memory cell. These problems, which can produce wide variations in the responses of adjacent cells to the same gate (or drain) voltage, are especially severe during erase operations and programming operations, as can be understood from the following explanation.

Before a nonvolatile memory array can be erased, the cells of the array must be programmed (i.e., data must be written thereto in an appropriate manner) to avoid erasing the cells into a very negative threshold and disturbing subsequent reads of data from the cells. After such a programming cycle, it may be necessary to verify whether each bit (each stored data value indicated by a cell) has the correct value (i.e., whether each cell has been programmed sufficiently). Then, after an erase cycle (which itself follows a preliminary programming cycle), another verification operation ("reverification") is performed to determine whether each cell has been sufficiently erased. Finally, after such an erase cycle, an additional adjustment procedure is often executed to tighten the distribution of memory element threshold voltages (e.g., to correct for overerasing of any cell). After the latter adjustment procedure (which can be very complicated) it is usually necessary to perform yet another verification operation to see whether each bit still has the correct (erased) value. As explained above, memory cell programming operations (as well as erase operations) typically include verification steps.

Each such verification and reverification operation assumes that there are variations in the characteristics of the various cells. Thus, each verification and reverification operation includes the steps of interrogating each cell, evaluating the cell's margin after the preceding process (e.g., programming, erasing, or adjustment), and deciding whether the cell should be reprogrammed or further erased. It is well known that the step of reading memory elements in a nonvolatile memory chip can be very noisy and difficult, even during a normal "read" memory access operation. However, it is even more difficult to read such memory elements during verification and reverification, since (in verification and reverification) the sense amplifier must perform in a much tighter environment as far as noise and margin are concerned (since the voltage levels have much less margin than in a normal "read" operation, as explained below).

Specifically, the sense amplifier employed in normal reading as well as verification (e.g., sense amplifier 19 of FIG. 1) is typically a differential amplifier that receives two signals: a signal from the selected cell (indicative of the cell's threshold voltage, $V_{th}$), and a reference signal equivalent to a reference threshold voltage, $V_{ref}$. In a normal "read" operation, reference voltage $V_{ref}$ is typically 4 volts, and the measured threshold voltage $V_{th}$ is typically 3 volts or 5.5 volts (depending on whether the cell stores a "1" or a "0" bit). Thus, the sense amplifier operates with substantial noise margins during a normal "read" operation.

During verification, however, the reference voltage $V_{ref}$ is typically 5.5 volts and an adequately programmed cell has a measured threshold voltage $V_{th}$ greater than 5.5 volts. Since the two inputs of the sense amplifier (a differential amplifier) in this case are much closer to each other than in a "normal" read operation, the sense amplifier's output is much more susceptible to error due to noise and the sense amplifier will respond much more slowly. Similarly, during reverification (following an erase cycle), the reference voltage $V_{ref}$ is typically 3 volts and an adequately erased cell has a measured threshold voltage $V_{th}$ less than 3 volts. In this latter case, the two inputs of the sense amplifier (differential amplifier) are also much more similar than in a "normal" read operation and the sense amplifier's output is much more susceptible to noise.

More specifically, a serious problem that often results from the effects of noise on sense amplifier operation during conventional verification (or reverification) can be understood by considering the following example. During conventional verification (or reverification), the sense amplifier output is "Anded" with a verification enable signal. For example in FIG. 1, the output of sense amplifier 19 is supplied to one input of AND gate 22, verification enable signal "VERIFY ENABLE" is supplied to the other input of AND gate 22, and the AND gate 22 outputs the signal "RAW VERIFY OK". The output of the AND gate (e.g., the signal RAW VERIFY OK) is asserted to a state machine (e.g., a state machine within control unit 29) to trigger execution of the next chip operation. The level of signal VERIFY ENABLE is a logical "1" only during each verification and reverification cycle. Thus, if the sense amplifier output becomes valid (i.e., a logical "1") at any instant during a verification or reverification operation, the signal RAW VERIFY OK is a logical "1" at a corresponding instant (and this instantaneous value of RAW VERIFY OK can cause the state machine to trigger execution of the appropriate chip operation).

However, the described conventional circuitry is subject to serious errors if the cell being interrogated has been inadequately programmed or inadequately erased. For example, if the cell is inadequately programmed to have a measured threshold voltage $V_{th}$ of only 5.3 volts, while sense amplifier 19 is set to output a logical "1" (indicating adequate programming of a cell) when the cell's measured threshold voltage exceeds a reference voltage $V_{ref}$ of 5.5 volts, small amounts of noise (e.g., noise on either input line of sense amplifier 19 due to fluctuations on a power supply line) can cause the sense amplifier output to oscillate between the correct logical level ("0") and the incorrect logical level ("1"). If there happens to be a small burst of noise at the end of the verification cycle for a selected cell, the sense amplifier output at such instant is erroneously a logical "1", the signal RAW VERIFY OK at the output of AND gate 22 is also erroneously a logical "1," and the state machine erroneously triggers execution of an inappropriate chip operation (an operation that would be appropriate only if the cell being interrogated were properly programmed, e.g., with a measured threshold voltage $V_{th}$ exceeding the reference voltage $V_{ref}$=5.5 volts). The same undesired result (triggering of an inappropriate chip operation) can occur during reverification of a cell (following an erase cycle intended to erase the cell) as a result of an erroneous value of RAW VERIFY OK which falsely indicates a proper (erased) state of the cell at the instant that the reverification cycle for the cell ends.

Until the present invention, nonvolatile memory verification and reverification operations (collectively referred to below as "verification" operations) had been subject to the described problem of erroneous results (erroneous values of output signal RAW VERIFY OK) due to noise effects on sense amplifier operation. The present invention eliminates this problem by treating the sense amplifier output as invalid if, at any time during a sampling period (rather than merely at the final instant of the sampling period), the threshold comparison indicates insufficient programming or erasing of a cell.

SUMMARY OF THE INVENTION

The verification method of the invention is a method for verifying the status of a selected nonvolatile memory cell of an integrated memory circuit (typically during a memory erase or programming operation). Another embodiment of the invention is an integrated nonvolatile memory circuit including means for performing this verification method. In preferred embodiments, each memory cell of the inventive integrated circuit is a flash memory cell.

The integrated circuit of the invention includes means for asserting successful verification data only if a measured threshold voltage of the cell differs from a reference voltage by at least a selected margin during a sampling period. In preferred embodiments, the integrated circuit of the invention includes logic means for asserting successful verification data only in response to continuous validity of a verification signal throughout such a sampling period, thereby avoiding false assertion of successful verification data. The sampling period is preferably longer than the expected duration of fluctuations (due to noise) in the verification signal.

Preferably, the logic means is implemented as a simple logic circuit comprising a flip-flop. During the verification operation, the logic circuit receives a raw verification signal indicative of the instantaneous relation between a measured threshold voltage of a memory cell and a reference voltage. The raw verification signal (which is typically the output of a sense amplifier gated through an AND gate) is "valid" if the threshold voltage has a desired relation to the reference voltage at an instant of time (e.g., if the threshold voltage of a programmed cell exceeds the reference voltage at this instant). The flip-flop remains in a first state as long as the raw verification signal is valid, but it enters a second state in response to the verification signal going "invalid" and remains in the second state for the rest of the sampling period. An output signal from the logic circuit indicates the state of the flip-flop at the end of the sampling period. In preferred embodiments, a first level of the output signal (indicating that the flip-flop is in the first state at the end of the sampling period) is interpreted as "successful verification data" and a second level of the output signal (indicating that the flip-flop is in the second state at the end of the sampling period) is interpreted as "unsuccessful verification data."

Preferably, a verification operation is performed in accordance with the invention at each of two or more stages of a memory erase operation (e.g., once after a programming cycle, and again after an erase cycle), and at least once (for each cell being programmed) during a memory programming operation. Each verification operation (for a selected memory cell) preferably has three portions: a setup cycle (in which a sense amplifier is powered up and enters a mode in which it is capable of asserting a valid raw verification signal); a sampling cycle (in which the sense amplifier asserts a raw verification signal indicative of the instantaneous relation between a measured threshold voltage of the cell and a reference voltage); and a hold cycle (in which the "successful" or "unsuccessful" verification data generated in accordance with the invention stays valid for the next cycle of a state machine controlling the overall memory erase or programming operation).

DETAILED DESCRIPTION OF THE INVENTION

Figure 1:
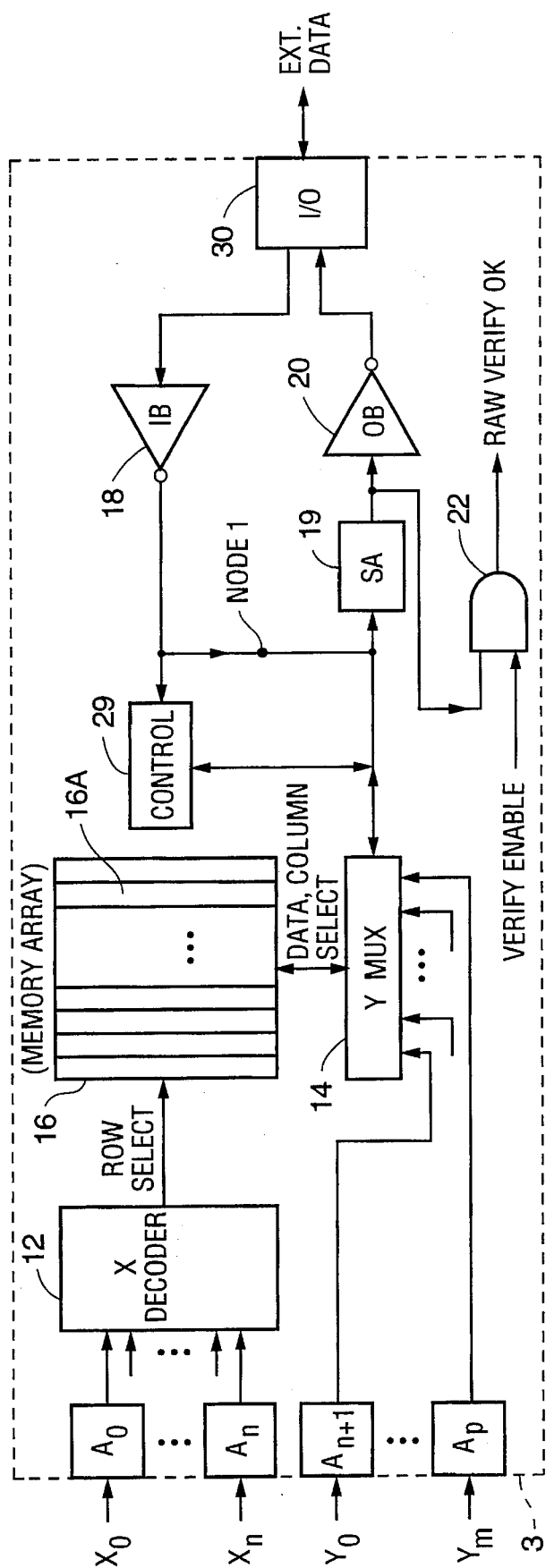
FIG. 1 is block diagram of a conventional memory circuit (implemented as an integrated circuit), including conventional means for verifying sense amplifier output.
Figure 2:
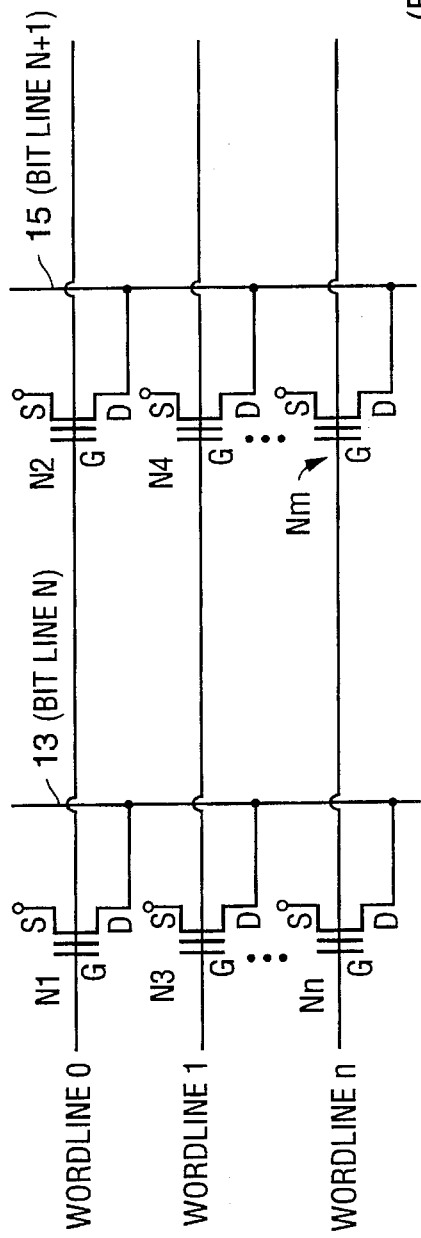
FIG. 2 is a simplified schematic diagram of two columns of memory cells of memory cell array 16 of FIG. 1.
Figure 3:
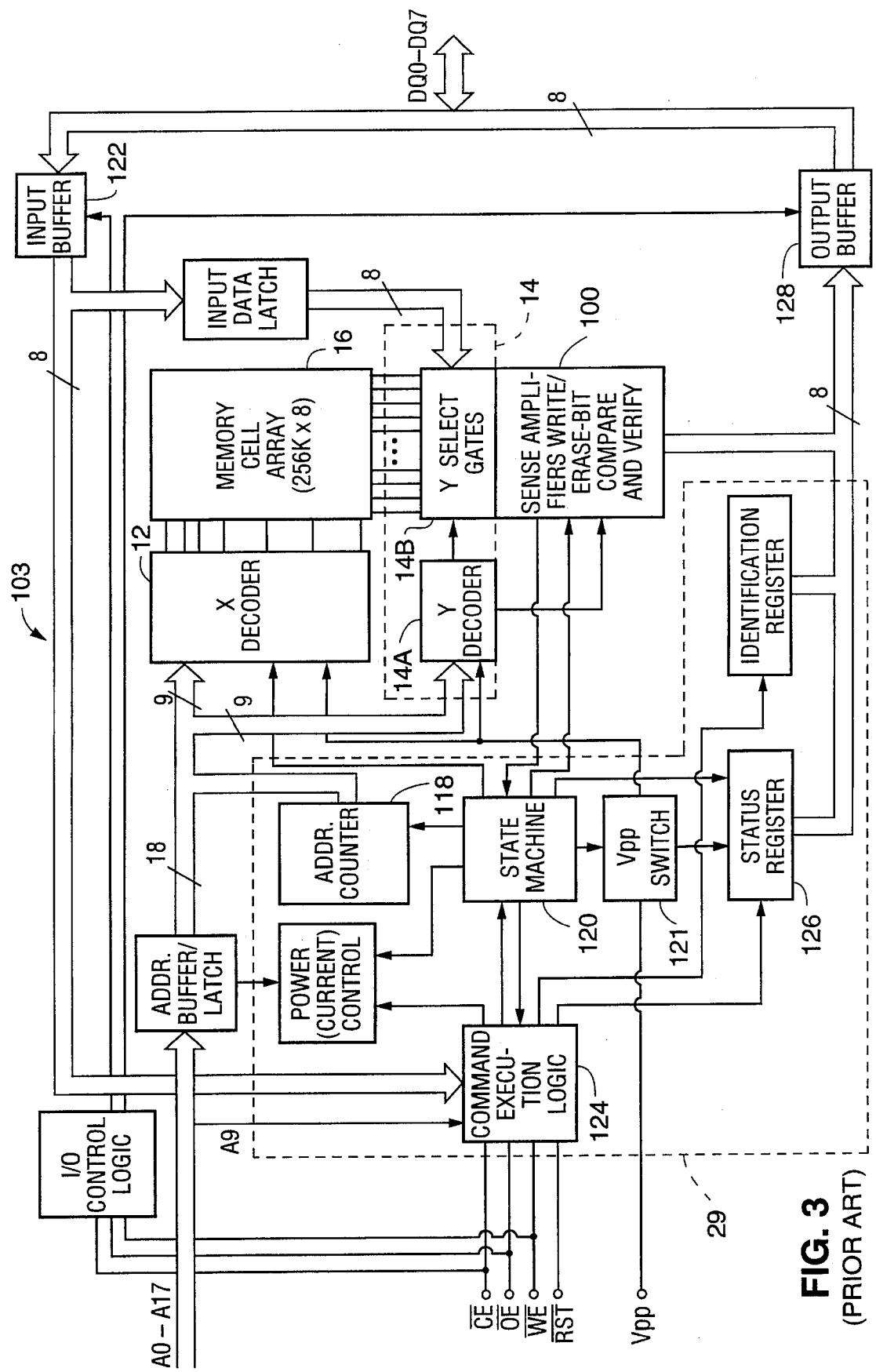
FIG. 3 is a block diagram of a conventional flash memory system.
Figure 4A:
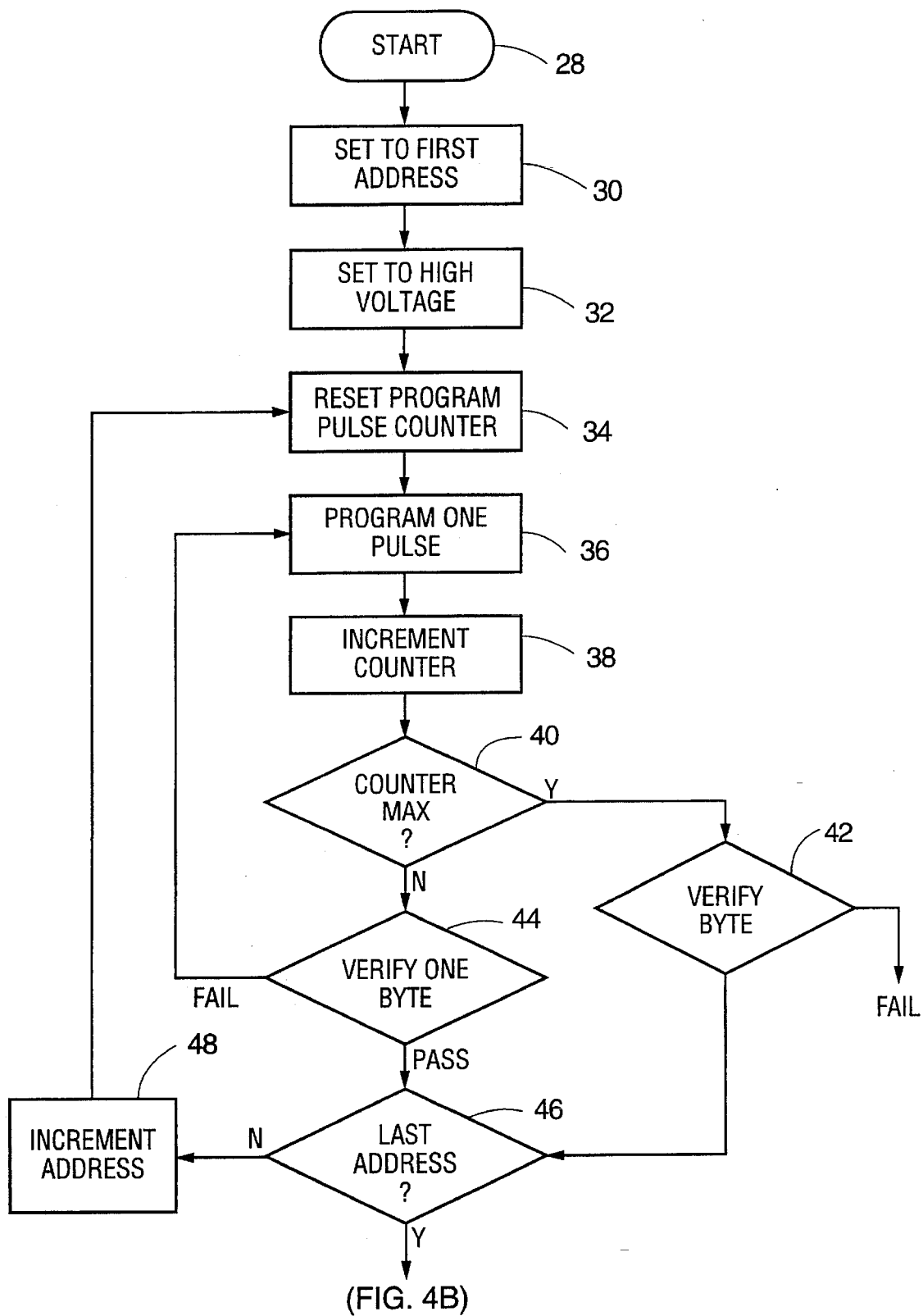
FIGS. 4A and 4B are a flow chart showing a typical memory erase sequence for a conventional flash memory.
Figure 4B:
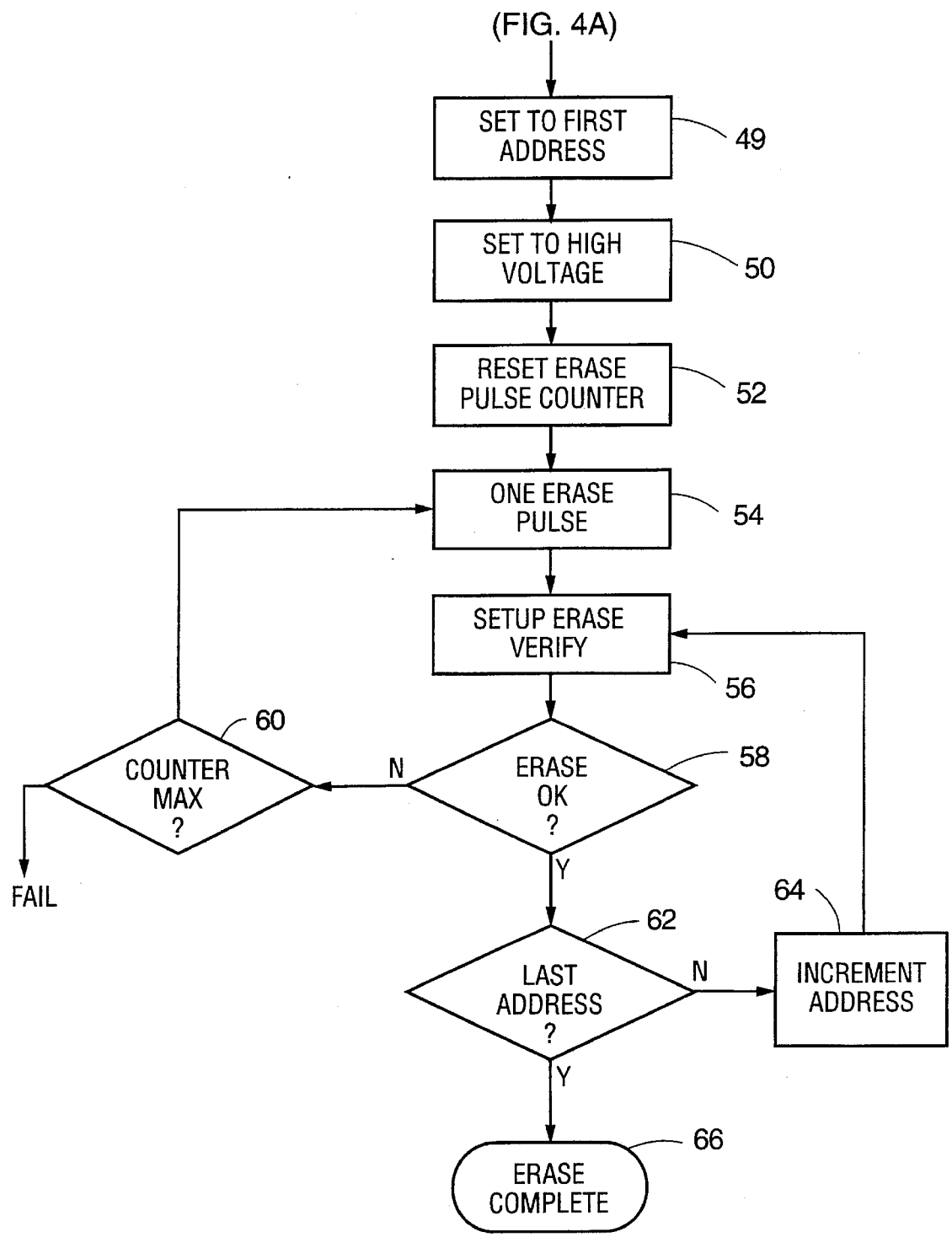

A first embodiment of the invention will be described with reference to FIGS. 5–7. This embodiment is a memory chip (identified by reference numeral 3') which includes nonvolatile memory array 16, and means (including logic means 24) for performing the inventive method of verifying the status of selected memory cells of array 16 during a memory erase operation.

Figure 5:
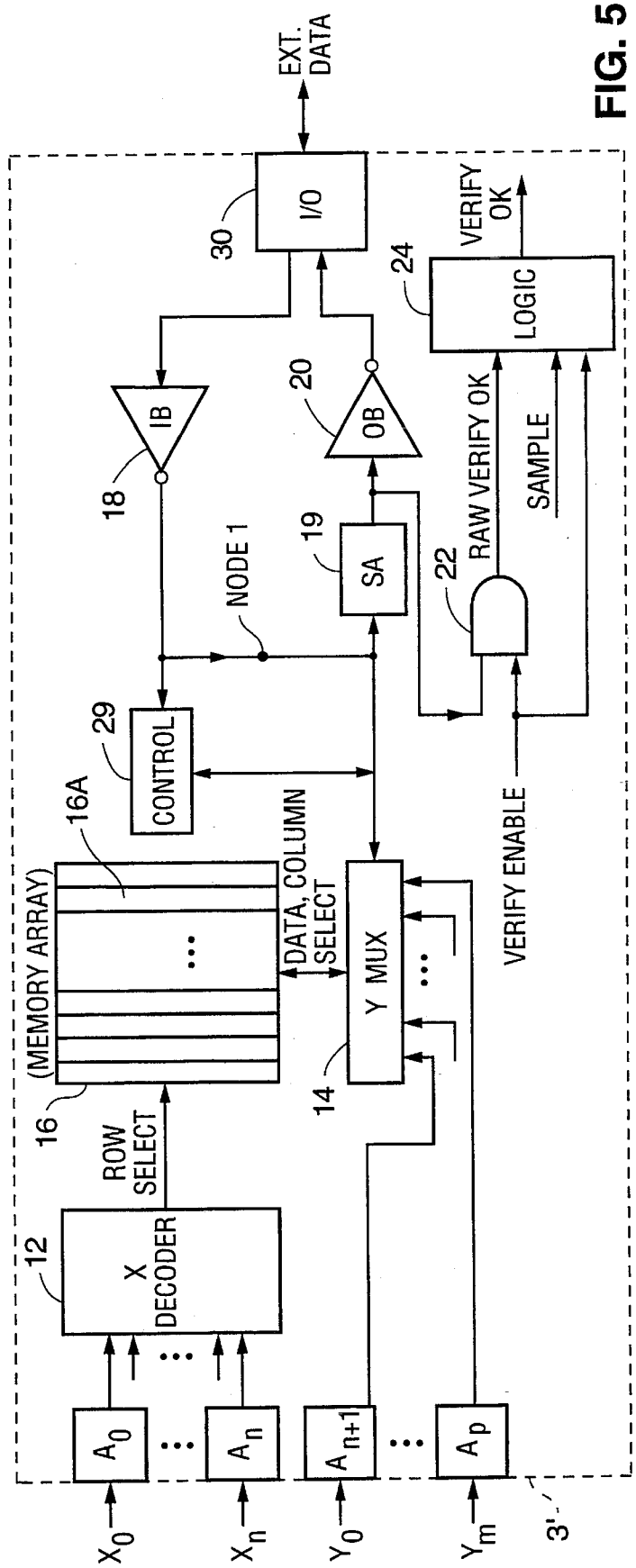
FIG. 5 is a block diagram of a memory circuit (implemented as an integrated circuit) which embodies the present invention.

Memory chip 3' of FIG. 5 is identical to conventional memory chip 3 of FIG. 1 except in the following two respects: chip 3' includes logic means 24 (for generating an output signal "VERIFY OK" used in performing the inventive verification method; and control unit 29 of chip 3' is programmed to cause chip 3' to perform the inventive verification operation (rather than a conventional verification operation). Only logic means 24 (and the verification operation performed by chip 3') will be described below, since the foregoing description of those elements of chip 3 (of FIG. 1) other than logic means 24 and the operation of chip 3 (other than the inventive verification operation) applies equally well to chip 3', and no purpose would be served by repeating it below. It is contemplated that in preferred embodiments of the invention, each nonvolatile memory cell in each memory array of the chip (e.g., each cell of nonvolatile array 16) is a flash memory cell.

Logic means 24 of chip 3' receives input signals "RAW VERIFY OK," "SAMPLE," and "VERIFY ENABLE," and generates in response the output signal "VERIFY OK."

To generate the verification signal "RAW VERIFY OK," AND gate 22 receives both the output of sense amplifier 19 and the signal "VERIFY ENABLE." Signal VERIFY ENABLE is supplied from control unit 29 to one input of AND gate 22 and to logic means 24. The level of signal VERIFY ENABLE is a logical "1" only during a verification operation (which is typically performed as a stage of a memory erase or programming procedure). If the sense amplifier output becomes valid (i.e., indicates a logical "1") at an instant during a verification operation, the signal RAW VERIFY OK is a logical "1" at a corresponding instant.

The output of sense amplifier 19 is indicative of the relation between a measured threshold voltage of a selected memory cell of array 16 and a reference voltage (the value of the reference voltage supplied to sense amplifier 19 is determined by control unit 29). Signal RAW VERIFY OK is thus a "verification" signal indicative of the instantaneous relation between the measured threshold voltage and the reference voltage during a verification operation. Verification signal RAW VERIFY OK is "valid" if the threshold voltage has a desired relation to the reference voltage (e.g., if the selected cell has been programmed during a programming cycle of the memory erase procedure or during a memory programming procedure, and the programmed cell's threshold voltage exceeds the reference voltage) at an instant of time during a verification operation.

The output signal "VERIFY OK" of means 24 is indicative of successful verification data only in response to continuous validity of verification signal RAW VERIFY OK during a "sampling period" determined by the signal SAMPLE. Each sampling period is a (relatively short) portion of a verification operation. SAMPLE has a first logic level (i.e., a logical "1") only during a sampling period. Each sampling period is preferably much longer than the expected duration of fluctuations (due to noise) in verification signal RAW VERIFY OK. The concept of the sampling period, and the sampling period's relation to the overall verification operation will be described in more detail below with reference to the timing diagram of FIG. 7.

The VERIFY ENABLE signal is supplied to logic means 24 to reset the circuit 24 before each verification operation. In the preferred embodiment of means 24 to be described with reference to FIG. 6, the VERIFY ENABLE signal resets a flip-flop within means 24.

Figure 6:
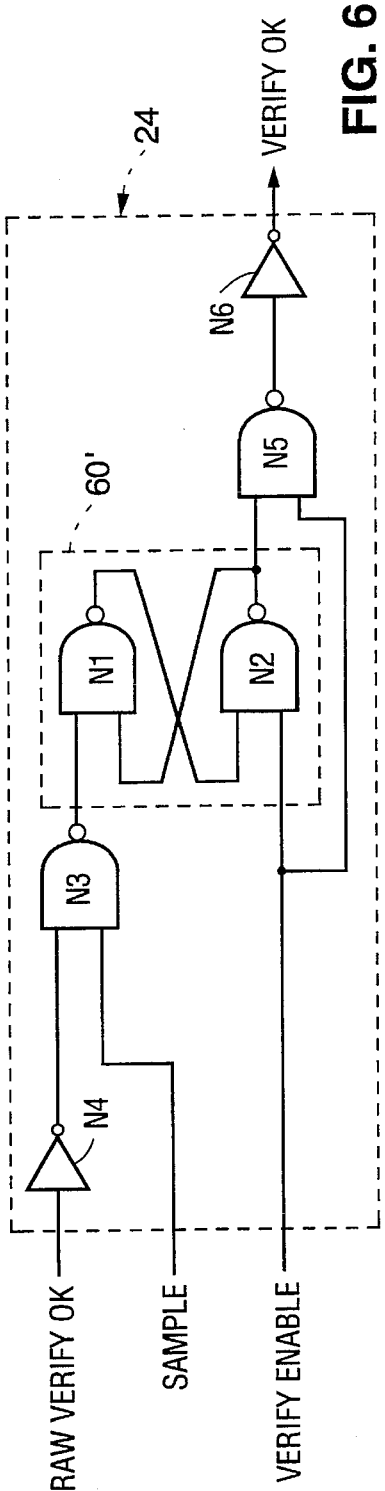
FIG. 6 is a schematic diagram of a preferred embodiment of logic means 24 of FIG. 5.

Although logic means 24 can be implemented in a variety of ways (including in software or firmware), it is preferably implemented in hardware as a simple logic circuit such as that shown in FIG. 6. The FIG. 6 embodiment of logic means 24 includes inverter N4 (whose input receives signal RAW VERIFY OK), NAND gate N3 (whose inputs receive the output of inverter N4 and signal SAMPLE), flip-flop circuit 60' (consisting of NAND gates N1 and N2 connected as shown), NAND gate N5 (whose inputs receive the output of the flip-flop and signal VERIFY ENABLE), and inverter N6 (whose input receives the output of N5 and whose output asserts the signal VERIFY OK).

Figure 7:
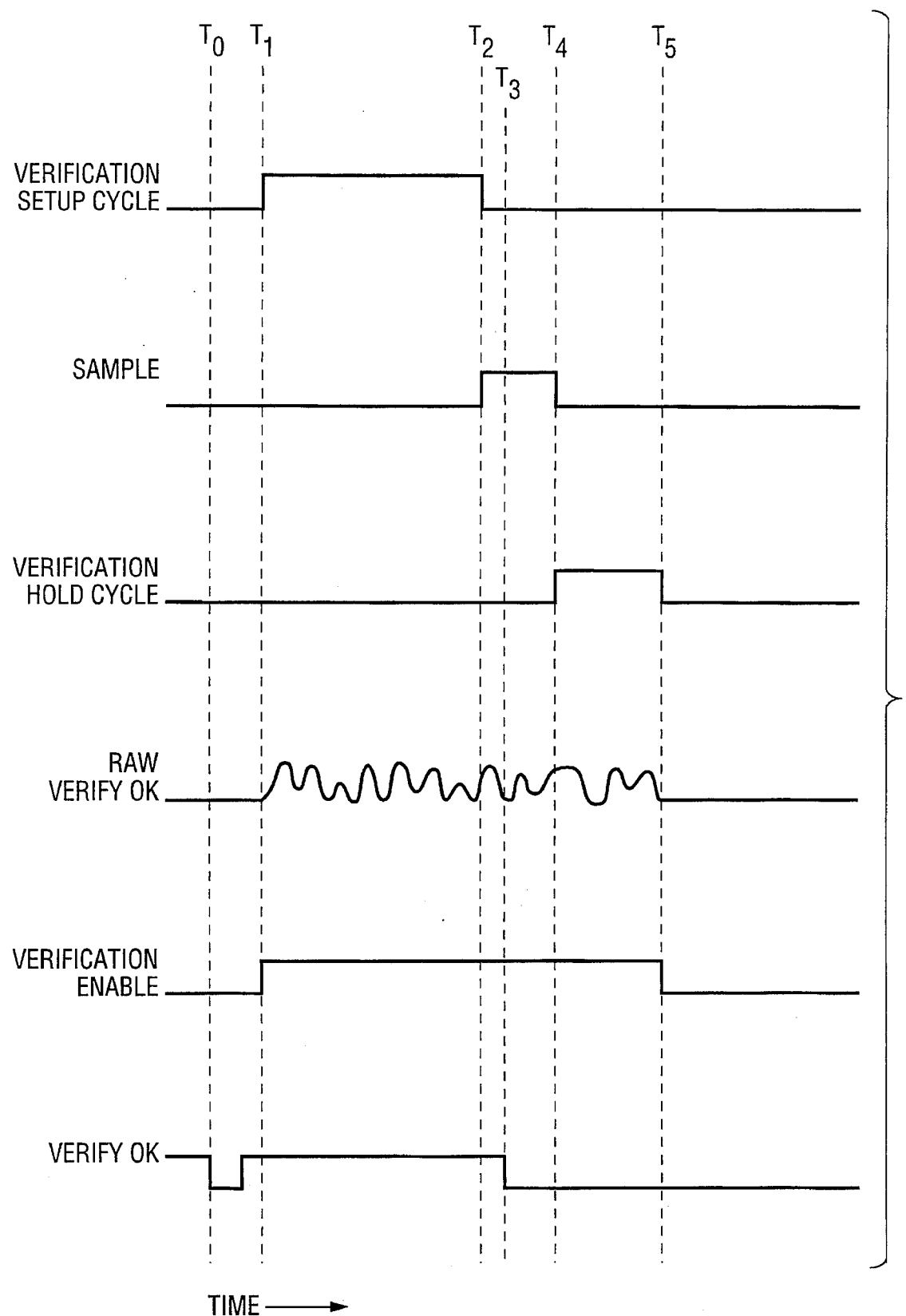
FIG. 7 is a timing diagram of signals generated in operation of the FIG. 5 circuit in accordance with the invention.

With reference to FIG. 7, we next describe the manner in which the FIG. 6 embodiment of logic means 24 (as included within chip 3') implements a verification operation in accordance with the invention. Such a verification operation (during an erase operation) typically sequentially verifies the status of all (or a selected subset of) the memory cells of array 16. Since a programming operation typically programs only one memory cell (or a small block of cells) of array 16 at a time, each verification operation during a programming operation typically verifies the status of such one cell (or small block of cells). For simplicity, the following description is limited to that portion of an overall verification operation that verifies the status of a single one of the cells of array 16. It should be understood that where several cells are to be verified, chip 3' simply repeats the verification procedure to be described for each cell to be verified. It should also be understood that chip 3' will typically perform an overall verification operation (sequentially verifying the status of all or many of the cells of array 16) at least twice during a single memory erase operation (in a manner to be described later with reference to FIG. 8).

To implement a verification operation for a single cell of array 16, control unit 29 of chip 3' generates control signals for dividing this verification operation into three stages: a verification setup cycle (performed from time t1 to time t2 as shown in FIG. 7); a sample cycle (performed, while signal SAMPLE has the logic level "1," from time t2 to time t4 as shown in FIG. 7); and a verification hold cycle (performed from time t4 to time t5 as shown in FIG. 7).

During the setup cycle, chip 3' causes sense amplifier 19 to power up and enter a mode in which it is capable of asserting a valid verification signal. The setup cycle should be long enough so that it includes a portion allowing for the settling time of sense amplifier 19 with respect to a typical cell being erased or programmed with the proper margin.

During the sampling cycle, sense amplifier 19 asserts (to AND gate 22) an output signal indicative of the relation between a measured threshold voltage of the cell and a reference voltage, and signal VERIFY OK output from logic means 24 (in response to RAW VERIFY OK output from AND gate 22) is indicative of "successful" or "unsuccessful" verification data. During the hold cycle, signal VERIFY OK at the output of logic means 24 remains valid for a time sufficiently long to enable it to be processed by control unit 29 (e.g., so that the state machine within control unit 29 which controls an erase operation being performed by chip 3' has sufficient time to respond to signal VERIFY OK).

The level of signal VERIFY ENABLE is a logical "1" during an entire verification operation (including all of its setup, sampling, and hold cycles).

With reference to FIGS. 6 and 7, the VERIFY ENABLE signal is low before time t0, and then goes high at the start (time t1) of a verification operation. In response to its low level prior to time t0, the output of flip-flop 60' is reset to have a "high" value. This occurs since a low value of VERIFY ENABLE causes the output of N2 to go high (at a time before the start of the verification operation so that SAMPLE is low and the output of N3 is high and the output of N1 is low). Then, when VERIFY ENABLE goes high (at the start of the verification period), the output of N2 remains high and the output of N1 remains low.

The state of flip-flop 60' when the output of N2 is high is denoted herein as the "first" state. Prior to time t1 with VERIFICATION ENABLE being low, VERIFY OK is low. When VERIFY ENABLE goes high, and when flip-flop 60' is in its first state, the signal VERIFY OK at the output of N6 is "high." Thus, throughout an entire verification operation (throughout which VERIFY ENABLE remains high), the signal VERIFY OK is "high" while flip-flop 60' remains in the first state (since the two inputs to N5 are high, the output of N5 is low, and the signal VERIFY OK output from N6 is high).

After flip-flop 60' has been reset, a verification operation commences (at time t1). Thereafter, the sample cycle of the verification operation commences (at time t2, when control unit 29 causes SAMPLE to undergo a low-to-high level transition). During the sample cycle (while SAMPLE remains high), flip-flop 60' remains in its first state for as long as signal RAW VERIFY OK remains "high" (i.e., for as long as RAW VERIFY OK is "valid" which indicates that the measured threshold voltage, of the cell undergoing verification, has a desired relation to the reference voltage being asserted to sense amplifier 19). Under these conditions, VERIFY OK remains high. This occurs because when RAW VERIFY OK is high (with SAMPLE high), the output of N4 is low and the output of N3 is high, so that the output of N2 will not change from the "high" value to which it has been reset (so that the output of N5 remains low and VERIFY OK remains high). For example, the FIG. 6 circuit will remain in this state throughout the entire sample cycle if the cell undergoing verification has been adequately programmed during a programming cycle, so that the programmed cell's threshold voltage exceeds sense amplifier 19's reference voltage by a sufficient margin so that RAW VERIFY OK remains continuously high (despite typical small fluctuations in the signal levels processed in the relevant circuits due to noise or the like).

If the cell undergoing verification has been inadequately programmed (or inadequately erased), such fluctuations will result in a low level or an oscillation in the level of RAW VERIFY OK as shown in FIG. 7.

If at any time during the sampling cycle, RAW VERIFY OK (for a cell that has been inadequately programmed or inadequately erased) becomes "invalid" by falling to the correct logical level ("low"), flip-flop 60' will change to its "second" state (in which the output of N2 is low) and remain in the second state for the rest of the sampling cycle (and thereafter, until it is reset). Specifically, flip-flop 60' enters the second state under these conditions because the output of N4 goes high, and thus the output of N3 goes low, the output of N1 goes high, and the output of N2 thus goes low (and N2 remains low despite a subsequent level transitions of RAW VERIFY OK until flip-flop 60' is reset by a low value on the VERIFY ENABLE line). Under these conditions (when flip-flop 60' enters its "second" state), output signal VERIFY OK goes low (as indicated at time t3 in FIG. 7) and remains low for the rest of the sampling cycle (and the subsequent hold cycle from t4 to t5). Chip 3' (e.g., control unit 29) interprets this low level of VERIFY 0K (occurring at the end of the sample cycle and throughout the subsequent hold cycle) as "unsuccessful verification data" indicating that the cell being verified has not been adequately programmed (for example, in case the verification operation follows the preliminary programming cycle of an erase operation) or has not been adequately erased (in case the verification operation follows the erase cycle of an erase operation).

Figure 8:
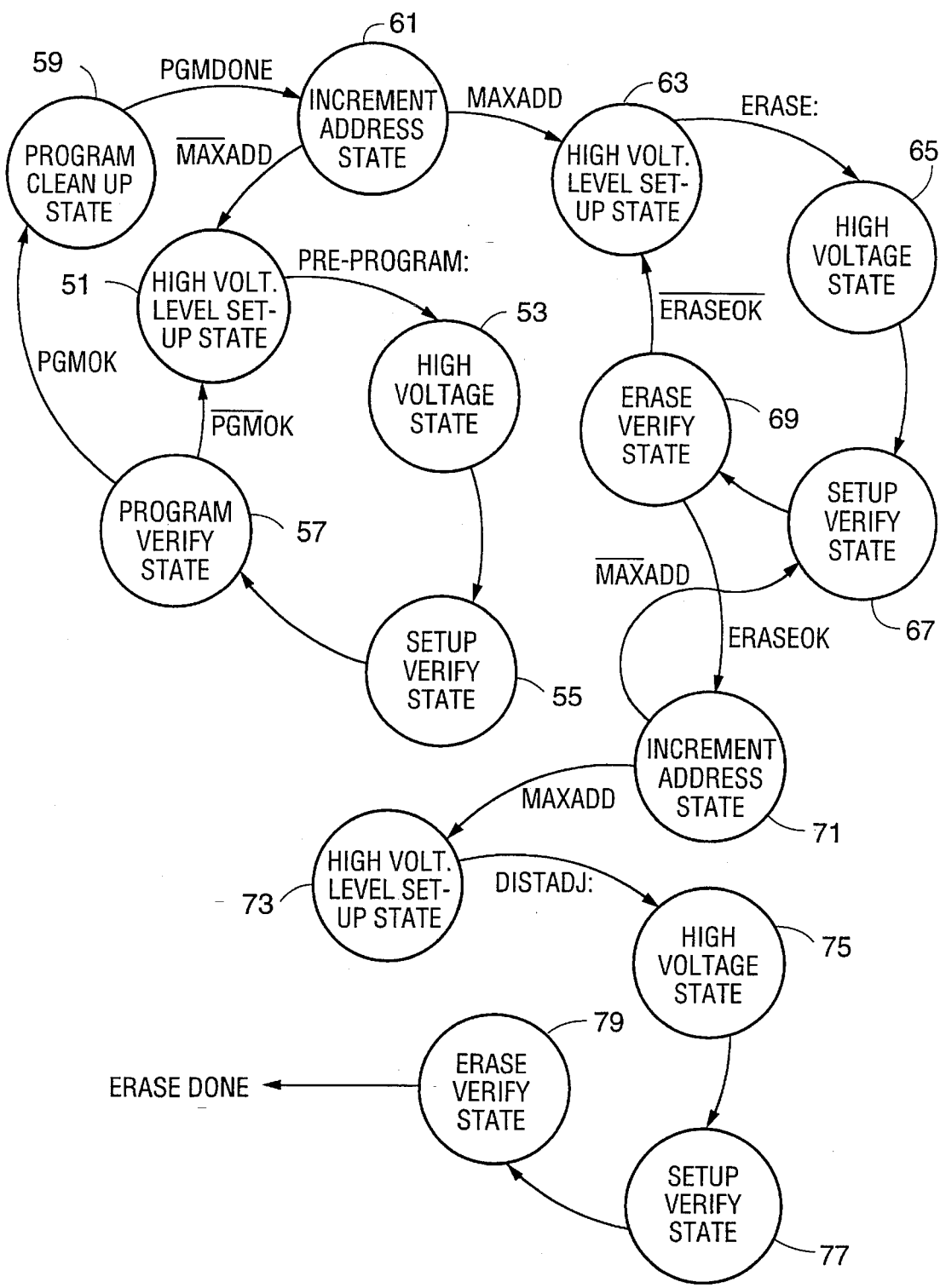
FIG. 8 is a flow chart of a data erase operation in accordance with the invention, which can be performed by the FIG. 5 circuit.

With reference to FIG. 8, we next describe a memory erase operation which embodies the invention, This method is implemented by chip 3' of FIG. 5 (in an embodiment in which each cell of array 16 is a flash memory device) under control of control unit 29. The erase operation of FIG. 8 comprises a preliminary programming cycle (steps 51–61), an erase cycle (steps 63–71), and a final distribution adjustment cycle (steps 73–79).

During the programming cycle, the cells to be erased are "programmed" (i.e., an appropriate charge is stored in the gate of each cell), principally to reduce the risk of subsequent overerasing of the cells (erasing the cells into a very negative threshold). During step 51, the circuitry for applying the appropriate voltage (a high voltage) to one of the cells is enabled. Then, during step 53, the cell is "programmed" by applying the appropriate voltage to its gate and drain.

Next, a verification operation in accordance with the invention is performed to verify the status of the cell (during steps 55 and 57). Step 55 is the setup cycle of the verification operation (the cycle from time t1 to time t2 in FIG. 7), and step 57 includes the sample and hold cycles of the verification operation (the cycles from time t2 to time t5 in FIG. 7).

If step 57 of the verification operation determines that the cell is not satisfactorily programmed, steps 51, 53, 55, and 57 are repeated in sequence (to reprogram the cell and verify whether the cell is satisfactorily programmed after such reprogramming).

If step 57 of the verification operation determines that the cell is satisfactorily programmed, program clean up step 59 is performed (to ready chip 3' for erasing or programming of another cell). After step 59, cell address incrementing step 61 is performed (to selected the address of the next cell to be programmed). If step 61 determines that all cells have been programmed, then step 63 is executed, Otherwise, step 61 selects the next cell to be programmed and steps 51, 53, 55, and 57 are repeated for this new cell.

At the start of the erase cycle (after the final iteration of step 61), all the cells have been programmed. Incrementing the address at this stage resets the address counter to point to the beginning of the block. During the first step of the erase cycle (step 63), circuitry is enabled for applying the appropriate voltage (a high voltage) to all of the cells. Then, during step 65, each cell is "erased" by applying the appropriate voltage to its source and gate.

Next, a verification operation in accordance with the invention is performed to verify the status of the cell to which the address counter points (during steps 67 and 69). Step 67 is the setup cycle of the verification operation (the cycle from time t1 to time t2 in FIG. 7), and step 69 includes the sample and hold cycles of the verification operation (the cycles from time t2 to time t5 in FIG. 7).

If step 69 of the verification operation determines that the cell is not satisfactorily erased, steps 63, 65, 67, and 69 are repeated in sequence (to re-trigger another high voltage cycle thereby re-erasing all the cells, and to verify whether the cell to which the address counter points is satisfactorily erased after such re-erasing).

If step 69 of the verification operation determines that the cell to which the address counter points is satisfactorily erased, cell address incrementing step 71 is performed (to select the address of the next cell to be verified). If step 71 determines that all cells have been erased, then step 73 is executed. Otherwise, step 71 selects the address of the next cell to be verified and steps 67 and 69 are repeated for this new cell.

After the final iteration of step 71, the chip performs the distribution adjustment cycle (steps 73–79). The purpose of this cycle is to tighten the distribution of memory cell threshold voltages (e.g., to correct for overerasing of any cell during the erase cycle. During step 73, the circuitry for applying the appropriate voltage (a high voltage) to all the cells is enabled. Then, during step 75, the cells are simultaneously (or substantially simultaneously) adjusted by applying the appropriate voltage to their gates. Then, yet another verification operation in accordance with the invention is performed to verify the status of all the cells (during steps 77 and 79), to determine whether each cell is still satisfactorily erased. Step 77 is the setup cycle of the verification operation (the cycle from time t1 to time t2 in FIG. 7), and step 79 includes the sample and hold cycles of the verification operation (the cycles from time t2 to time t5 in FIG. 7, performed with a sufficient number of iterations to verify the status of all the cells).

After step 79, the chip (e.g., control unit 29 of the chip) asserts data indicating the result of the final verification operation (e.g., to an output pad such as pad 30 which can be accessed by an external device), and asserts a control signal ("Erase Done") indicating that the overall erase operation has been completed.

Preferred embodiments of the invention have been described with reference to FIGS. 5–8. Although these embodiments have been described in some detail, it is contemplated that changes from any of these embodiments can be made without departing from the spirit and scope of the invention as defined by the appended claims.

What is claimed is:

1. An integrated nonvolatile memory circuit, including:

an array of nonvolatile memory cells;

selection means for connecting a selected one of the cells to a first node;

first means connected to the first node for generating a raw verification signal indicative of an instantaneous relation between a measured threshold voltage of the selected one of the memory cells and a reference voltage, said raw verification signal being valid if the threshold voltage has a desired relation to the reference voltage at an instant of time; and second means for processing the raw verification signal to generate a verification signal indicative of whether the threshold voltage differs from the reference voltage by at least a selected margin during a sampling period.

2. The memory circuit of claim 1, wherein the verification signal is indicative of whether the raw verification signal remains valid continuously during the sampling period.

3. The memory circuit of claim 2, wherein the sampling period is longer than an expected duration of fluctuations due to noise in the raw verification signal.

4. The memory circuit of claim 2, wherein the first means includes:

a sense amplifier having an input terminal connected to the first node and an output terminal which asserts the raw verification signal.

5. The memory circuit of claim 4, also including:

logic means for receiving the raw verification signal from the sense amplifier and asserting said raw verification signal to the second means during a verification operation including said sampling period.

6. The memory circuit of claim 2, wherein the second means includes:

a flip-flop circuit which undergoes a transition from a first state to a second state in response to the raw verification signal going invalid during the sampling period, wherein the verification signal is indicative of whether the flip-flop circuit is in the first state or the second state at the end of the sampling period;

logic means for receiving the raw verification signal and asserting said raw verification signal to the flip-flop only during the sampling period; and means for setting the flip-flop to the first state before the sampling period.

7. The memory circuit of claim 1, wherein the nonvolatile memory cells are flash memory cells.

8. An integrated nonvolatile memory circuit, capable of executing a verification operation including a setup period, a sampling period which follows the setup period, and a hold period which follows the sampling period, said memory circuit including:

an array of nonvolatile memory cells;

selection means for connecting a selected one of the cells to a first node;

first means connected to the first node for generating a raw verification signal indicative of an instantaneous relation between a measured threshold voltage of the selected one of the memory cells and a reference voltage, said raw verification signal being valid if the threshold voltage has a desired relation to the reference voltage at an instant of time;

second means for processing the raw verification signal to generate a verification signal indicative of whether the threshold voltage differs from the reference voltage by at least a selected margin during the sampling period; and control means for controlling execution of the verification operation.

9. The memory circuit of claim 8, wherein the verification signal is indicative of whether the raw verification signal remains valid continuously during the sampling period.

10. The memory circuit of claim 9, wherein the sampling period is longer than an expected duration of fluctuations due to noise in the raw verification signal.

11. The memory circuit of claim 9, wherein the first means includes:

a sense amplifier having an input terminal connected to the first node and an output terminal which asserts the raw verification signal.

12. The memory circuit of claim 9, wherein the second means includes:

a flip-flop circuit which undergoes a transition from a first state to a second state in response to the raw verification signal going invalid during the sampling period, wherein the verification signal is indicative of whether the flip-flop circuit is in the first state or the second state at the end of the sampling period;

logic means for receiving the raw verification signal and asserting said raw verification signal to the flip-flop during the sampling period; and means for setting the flip-flop to the first state before the sampling period.

13. The memory circuit of claim 8, wherein the control means includes means for enabling the first means during the setup period, and means for receiving and processing the verification signal during the hold period.

14. The memory circuit of claim 8, wherein the nonvolatile memory cells are flash memory cells.

15. A verification method for verifying status of a selected memory cell of a nonvolatile memory integrated circuit, including the steps of:

(a) receiving a raw verification signal indicative of an instantaneous relation between a measured threshold voltage of the memory cell and a reference voltage, where the raw verification signal is valid if the threshold voltage has a desired relation to the reference voltage at an instant of time; and (b) processing the raw verification signal to generate a verification signal indicative of whether the threshold voltage differs from the reference voltage by at least a selected margin during a sampling period.

16. The method of claim 15, wherein the verification signal is indicative of whether the raw verification signal remains valid continuously during the sampling period.

17. The method of claim 16, wherein the sampling period is longer than an expected duration of fluctuations due to noise in the raw verification signal.

18. The method of claim 16, wherein step (a) includes the step of processing a first signal indicative of the measured threshold voltage of the memory cell and a second signal indicative of the reference voltage in a sense amplifier to generate said raw verification signal.

19. The method of claim 18, also including the steps of:

(c) before step (a), executing a verification setup operation in which the sense amplifier is enabled; and (d) after step (b), executing a verification hold operation in which the verification signal is held at least during a cycle of a state machine controlling an overall memory operation.

20. The method of claim 19, wherein the verification setup operation has sufficient duration so that it includes a portion allowing for settling time of the sense amplifier with respect to the memory cell whose status is being verified.

21. The method of claim 16, wherein step (b) includes the steps of:

setting a flip-flop to a first state before the sampling period;

asserting the raw verification signal to the flip-flop during the sampling period, to cause the flip-flop to enter a second state and remain in said second state in response to the raw verification signal going invalid during the sampling period, wherein the verification signal is indicative of whether the flip-flop is in the first state or the second state at the end of the sampling period.

22. A method for erasing at least some memory cells of a nonvolatile memory integrated circuit, including the steps of:

(a) programming the memory cells to a first desired threshold voltage;

(b) after step (a), verifying status of the memory cells;

(c) after step (b), erasing the memory cells to a second desired threshold voltage; and (d) after step (c), verifying status of the memory cells, wherein each of steps (b) and (d) includes the steps of:

(e) receiving a raw verification signal indicative of an instantaneous relation between a measured threshold voltage of one of the memory cells and a reference voltage, where the raw verification signal is valid if the threshold voltage has a desired relation to the reference voltage at an instant of time; and (f) processing the raw verification signal to generate a verification signal indicative of whether the threshold voltage differs from the reference voltage by a sufficient margin during a sampling period.

23. The method of claim 22, wherein the verification signal is indicative of whether the raw verification signal remains valid continuously during the sampling period.

24. The method of claim 23, wherein the sampling period is longer than an expected duration of fluctuations due to noise in the raw verification signal.

25. The method of claim 23, wherein step (e) includes the step of processing a first signal indicative of the measured threshold voltage of the memory cell and a second signal indicative of the reference voltage in a sense amplifier to generate said raw verification signal.

26. The method of claim 23, wherein step (b) includes the steps of:

(g) after step (f), executing a hold operation in which the verification signal is received and processed in a control means; and (h) repeating step (a) if the control means determines as a result of step (g) that at least one of the memory cells is inadequately programmed.

27. The method of claim 23, wherein step (d) includes the steps of:

(g) after step (f), executing a hold operation in which the verification signal is received and processed in a control means; and (h) repeating step (c) if the control means determines during step (g) that at least one of the memory cells is inadequately erased.

28. A method for programming at least one memory cell of a nonvolatile memory integrated circuit, including the steps of:

(a) programming the memory cell to a first desired threshold voltage; and (b) after step (a), verifying status of the memory cell, wherein step (b) includes the steps of:

(c) receiving a raw verification signal indicative of an instantaneous relation between a measured threshold voltage of the memory cell and a reference voltage, where the raw verification signal is valid if the threshold voltage has a desired relation to the reference voltage at an instant of time; and (d) processing the raw verification signal to generate a verification signal indicative of whether the threshold voltage differs from the reference voltage by a sufficient margin during a sampling period.

29. The method of claim 28, wherein the sampling period is longer than an expected duration of fluctuations due to noise in the raw verification signal.

* * * * *